(12) United States Patent
Klinge et al.

(10) Patent No.: US 6,822,450 B2
(45) Date of Patent: Nov. 23, 2004

(54) MULTIPLE CHANNEL, CARDIAC ARRAY FOR SENSITIVITY ENCODING IN MAGNETIC RESONANCE IMAGING

(75) Inventors: Julia Helena Anna Klinge, Milwaukee, WI (US); Eddy Benjamin Boskamp, Menomonee Falls, WI (US); Steven Christopher Davis, Oconomowoc, WI (US); Deependra D. Gangakhedkar, Waukesha, WI (US); Scott Allen Lindsay, Dousman, WI (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 10/063,471

(22) Filed: Apr. 26, 2002

(65) Prior Publication Data

US 2003/0201774 A1 Oct. 30, 2003

(51) Int. Cl.⁷ .................................................. G01V 3/00
(52) U.S. Cl. ..................................................... 324/318
(58) Field of Search .................................. 324/307, 309, 324/318, 322, 300; 600/410, 422; 333/219; 334/318, 322, 307, 309

(56) References Cited

U.S. PATENT DOCUMENTS

| 4,692,705 A | | 9/1987 | Hayes ......................... 324/318 |
| 4,825,162 A | * | 4/1989 | Roemer et al. .............. 324/318 |
| 4,943,775 A | | 7/1990 | Boskamp et al. ........... 324/322 |
| 4,945,321 A | * | 7/1990 | Oppelt et al. ................ 333/119 |

(List continued on next page.)

FOREIGN PATENT DOCUMENTS

WO   WO 01/69277 A2   9/2001

OTHER PUBLICATIONS

"Planar Strip Array (PSA) for MRI," *Magnetic Resonance in Medicine*, Ray F. Lee, Charles R. Westgate, Robert G. Weiss, David C. Newman, and Paul Bottomley, (2001), pp. 673–683.
"SENSE: Sensitivity Encoding for Fast MRI," *Magnetic Resonance in Medicine*, Klaas P. Pruessman, Markus Weiger, Markus B. Scheidegger, and Peter Boesiger, (1999), pp. 952–962.
"The NMR Phased Array," P.B. Roemer, W.A. Edelstein, C.E. Hayes, S.P. Souza and O.M. Mueller, *Magnetic Resonance in Medicine 16*, (1990) pp. 192–225.
"Specific Coil Design for SENSE: A Six–Element Cardiac Array," *Magnetic Resonance in Medicine*, Markus Weiger, Klaas P. Pruessman, Christoph Leussler, Peter Roschmann, and Peter Boesiger, (2001), pp. 495–504.
PCT Search Report for EP 03252631.1–1234–.
P.M. Jakob, M.A. Griswold, R.R. Edelman, W.J. Manning, D.K. Sodickson; "Cardiac Imagining with SMASH;" Proceedings of the International Society for Magnetic Resonance in Medicine, 1998; p. 16.
M.A. Griswold, P. M. Jakob, R.R. Edelman, and D. K. Sodickson, "A multicoil array designed for cardiac SMASH imaging;" Magnetic Resonance Materials in Physics, Biology an d Medicine, vol. 10, 2000, pp. 105–113.

(List continued on next page.)

*Primary Examiner*—Diego Gutierrez
*Assistant Examiner*—Dixomara Vargas
(74) *Attorney, Agent, or Firm*—Cantor Colburn LLP

(57) ABSTRACT

A multiple channel array coil for magnetic resonance imaging is disclosed. In an exemplary embodiment, the array coil includes an anterior section and a posterior section. The anterior and posterior sections are displaced from one another about a first direction, with both of the anterior and posterior sections further including a left portion and a right portion displaced from one another about a second direction. Each of the left and right portions further include a superior coil element and an inferior coil element displaced from one another about a third direction.

17 Claims, 3 Drawing Sheets

U.S. PATENT DOCUMENTS

| | | | | |
|---|---|---|---|---|
| 4,947,121 A | * | 8/1990 | Hayes | 324/322 |
| 4,973,907 A | | 11/1990 | Bergman et al. | 324/318 |
| 5,006,803 A | | 4/1991 | Boskamp et al. | 324/311 |
| 5,030,915 A | | 7/1991 | Boskamp et al. | 324/318 |
| 5,198,768 A | * | 3/1993 | Keren | 324/318 |
| 5,256,971 A | | 10/1993 | Boskamp | 324/318 |
| 5,399,970 A | | 3/1995 | Pelc et al. | 324/309 |
| 5,430,378 A | * | 7/1995 | Jones | 324/318 |
| 5,477,146 A | * | 12/1995 | Jones | 324/318 |
| 5,548,218 A | * | 8/1996 | Lu | 324/318 |
| 5,557,247 A | | 9/1996 | Vaughn, Jr. | 333/219 |
| 5,578,925 A | * | 11/1996 | Molyneaux et al. | 324/318 |
| 5,682,098 A | | 10/1997 | Vij | 324/318 |
| 5,757,189 A | * | 5/1998 | Molyneaux et al. | 324/318 |
| 5,759,152 A | | 6/1998 | Felmlee et al. | 600/410 |
| 5,861,749 A | * | 1/1999 | Van Heelsbergen | 324/322 |
| 5,905,378 A | | 5/1999 | Giaquinto et al. | 324/318 |
| 5,998,999 A | | 12/1999 | Richard et al. | 324/318 |
| 6,029,082 A | | 2/2000 | Srinivasan et al. | 600/422 |
| 6,097,186 A | * | 8/2000 | Nabetani | 324/319 |
| 6,150,816 A | * | 11/2000 | Srinivasan | 324/318 |
| 6,246,897 B1 | | 6/2001 | Foo et al. | 600/413 |
| 6,249,121 B1 | | 6/2001 | Boskamp et al. | 324/318 |
| 6,255,816 B1 | | 7/2001 | Robitaille | 324/300 |
| 6,323,648 B1 | * | 11/2001 | Belt et al. | 324/322 |
| 6,344,745 B1 | | 2/2002 | Reisker et al. | 324/318 |
| 6,396,269 B1 | * | 5/2002 | Hajnal et al. | 324/307 |
| 6,414,485 B1 | * | 7/2002 | Kato et al. | 324/307 |
| 6,441,615 B1 | * | 8/2002 | Fujita et al. | 324/318 |
| 6,448,774 B1 | * | 9/2002 | Heid | 324/318 |
| 6,534,983 B1 | * | 3/2003 | Boskamp et al. | 324/318 |
| 6,559,642 B2 | * | 5/2003 | King | 324/307 |
| 2001/0005136 A1 | | 6/2001 | Misic | 324/318 |
| 2002/0011843 A1 | | 1/2002 | Harvey | 324/307 |

OTHER PUBLICATIONS

J.A. Bankson, M.A. Griswold, S.M. Wright, D. K. Sodickson; "SMASH imaging with an eight element multiplexed RF coil array;" Magnetic Resonance Materials in Physics, Biology and Medicine, vol. 10, 2000, pp. 93—104.

D. K. Sodickson, M. Stuber, R.M. Botnar, K.V. Kissinger, W.J. Manning, "Accelerated Coronary MRA in Volunteers and Patients Using Double–Obilque 3D Acquisitions with SMASH Reconstruction;" Proceedings of the International Society for Magnetic Resonance in Medicine, 1999, vol. 7, 1999, p. 1249.

* cited by examiner

MULTIPLE CHANNEL, CARDIAC ARRAY FOR SENSITIVITY ENCODING IN MAGNETIC RESONANCE IMAGING

BACKGROUND OF THE INVENTION

The present disclosure relates generally to magnetic resonance imaging (MRI) systems and, more particularly, to a multiple channel, cardiac array for sensitivity encoding (SENSE) in MRI.

A conventional MRI device establishes a homogenous magnetic field, for example, along an axis of a person's body that is to undergo MRI. This homogeneous magnetic field conditions the interior of the person's body for imaging by aligning the nuclear spins of nuclei (in atoms and molecules forming the body tissue) along the axis of the magnetic field. If the orientation of the nuclear spin is perturbed out of alignment with the magnetic field, the nuclei attempt to realign their nuclear spins with an axis of the magnetic field. Perturbation of the orientation of nuclear spins may be caused by application of radio frequency (RF) pulses. During the realignment process, the nuclei precess about the axis of the magnetic field and emit electromagnetic signals that may be detected by one or more coils placed on or about the person.

The frequency of the nuclear magnetic radiation (NMR) signal emitted by a given precessing nucleus depends on the strength of the magnetic field at the nucleus' location. As is well known in the art, it is possible to distinguish radiation originating from different locations within the person's body simply by applying a field gradient the magnetic field across the person's body. For the sake of convenience, direction of this field gradient may be referred to as the left-to-right direction. Radiation of a particular frequency may be assumed to originate at a given position within the field gradient, and hence at a given left-to-right position within the person's body. The application of such a field gradient is also referred to as frequency encoding.

However, the simple application of a field gradient does not allow for two-dimensional resolution, since all nuclei at a given left-to-right position experience the same field strength, and hence emit radiation of the same frequency. Accordingly, the application of a frequency-encoding gradient, by itself, does not make it possible to discern radiation originating from the top versus radiation originating from the bottom of the person at a given left-to-right position. Resolution has been found to be possible in this second direction by application of gradients of varied strength in a perpendicular direction to thereby perturb the nuclei in varied amounts. The application of such additional gradients is also referred to as phase encoding.

Frequency-encoded data sensed by the coils during a phase encoding step is stored as a line of data in a data matrix known as the k-space matrix. Multiple phase encoding steps are performed in order to fill the multiple lines of the k-space matrix. An image may be generated from this matrix by performing a Fourier transformation of the matrix to convert this frequency information to spatial information representing the distribution of nuclear spins or density of nuclei of the image material.

MRI has proven to be a valuable clinical diagnostic tool for a wide range of organ systems and pathophysiologic processes. Both anatomic and functional information can be gleaned from the data, and new applications continue to develop as the technology and techniques for filling the k-space matrix improve. As technological advances have improved achievable spatial resolution, for example, increasingly finer anatomic details have been able to be imaged and evaluated using MRI. Often, however, there is a tradeoff between spatial resolution and imaging time, since higher resolution images require a longer acquisition time. This balance between spatial and temporal resolution is particularly important in cardiac MRI, for example, where fine details of coronary artery anatomy must be discerned on the surface of a rapidly beating heart.

Imaging time is largely a factor of the speed with which the MRI device can fill the k-space matrix. In conventional MRI, the k-space matrix is filled one line at a time. Although many improvements have been made in this general area, the speed with which the k-space matrix may be filled is limited. To overcome these inherent limits, several techniques have been developed to simultaneously acquire multiple lines of data for each application of a magnetic field gradient. These techniques, which may collectively be characterized as "parallel imaging techniques", use spatial information from arrays of RF detector coils to substitute for the encoding which would otherwise have to be obtained in a sequential fashion using field gradients and RF pulses. The use of multiple effective detectors has been shown to multiply imaging speed, without increasing gradient switching rates or RF power deposition.

One such parallel imaging technique that has recently been developed and applied to in vivo imaging is referred to as SENSE (SENSitivity Encoding). The SENSE technique is based on the recognition of the fact that the spatial sensitivity profile of the receiving elements (e.g., resonators, coils, antennae) impresses on the spin resonance signal position information that can be used for the image reconstruction. The parallel use of a plurality of separate receiving elements, with each element having a different respective sensitivity profile, and combination of the respective spin resonance signals detected enables a reduction of the acquisition time required for an image (in comparison with conventional Fourier image reconstruction) by a factor which in the most favorable case equals the number of the receiving members used (see Pruessmann et al., Magnetic Resonance in Medicine Vol. 42, p. 952–962, 1999).

A drawback of the SENSE technique, however, results when the component coil sensitivities are either insufficiently well characterized or insufficiently distinct from one another. These instabilities may manifest as localized artifacts in the reconstructed image, or may result in degraded signal-to-noise ratio (SNR).

Accordingly, it is desirable to implement RF coil arrays in MRI systems that (among other aspects) provide increased SNR with or without the use of parallel imaging techniques such as SENSE.

SUMMARY OF INVENTION

The above discussed and other drawbacks and deficiencies of the prior art are overcome or alleviated by a multiple channel array coil for magnetic resonance imaging. In an exemplary embodiment, the array coil includes an anterior section and a posterior section. The anterior and posterior sections are displaced from one another about a first direction, with both of the anterior and posterior sections further including a left portion and a right portion displaced from one another about a second direction. Each of the left and right portions further include a superior coil element and an inferior coil element displaced from one another about a third direction.

In another aspect, a multiple channel array coil for magnetic resonance imaging has an anterior section and a posterior section. The anterior and posterior sections are symmetrically arranged and displaced from one another about a first direction, with both of the anterior and posterior sections further including a left portion and a right portion symmetrically arranged and displaced from one another about a second direction. Each of the left and right portions further include a superior coil element and an inferior coil element displaced from one another about a third direction. The coil elements are generally rectangular in shape and are formed from a generally flat, conductive material.

In still another aspect, a magnetic resonance imaging (MRI) system includes a computer, a magnet assembly for generating a polarizing magnetic field, and a gradient coil assembly for applying gradient waveforms to the polarizing magnetic field along selected gradient axes. In addition, a radio frequency (RF) transceiver system is used for applying RF energy to excite nuclear spins of an object to be imaged, and for thereafter detecting signals generated by excited nuclei of the object to be imaged. The RF transceiver system further includes a multiple channel array coil having an anterior section and a posterior section. The anterior and posterior sections are displaced from one another about a first direction, with both of the anterior and posterior sections further including a left portion and a right portion displaced from one another about a second direction. Each of the left and right portions further include a superior coil element and an inferior coil element displaced from one another about a third direction. The signals detected by the multiple channel array coil are processed by the computer to produce MR images of the object to be imaged.

In yet another aspect, a method for configuring a multiple channel array coil suitable for use in sensitivity encoding for magnetic resonance imaging (MRI) includes arranging a first set of individual coil elements into an anterior section and arranging a second set of individual coil elements into a posterior section. The anterior and posterior sections are displaced from one another about a first direction, and both of the anterior and posterior sections are further arranged into a left portion and a right portion that are displaced from one another about a second direction. Each of the left and right portions are further arranged from a superior coil element and an inferior coil element displaced from one another about a third direction.

Finally, in still a further aspect, method for implementing sensitivity encoding for magnetic resonance imaging (MRI) includes generating a polarizing magnetic field and applying gradient waveforms to the polarizing magnetic field along selected gradient axes. RF energy generated by an RF transceiver system is then applied to excite nuclear spins of an object to be imaged, and thereafter signals generated by excited nuclei of the object to be imaged are detected. The RF transceiver system further includes a multiple channel array coil having an anterior section and a posterior section. The anterior and posterior sections are displaced from one another about a first direction, with both of the anterior and posterior sections further including a left portion and a right portion displaced from one another about a second direction. Each of the left and right portions further include a superior coil element and an inferior coil element displaced from one another about a third direction.

BRIEF DESCRIPTION OF DRAWINGS

Referring to the exemplary drawings wherein like elements are numbered alike in the several Figures.

DETAILED DESCRIPTION

Figure 1:
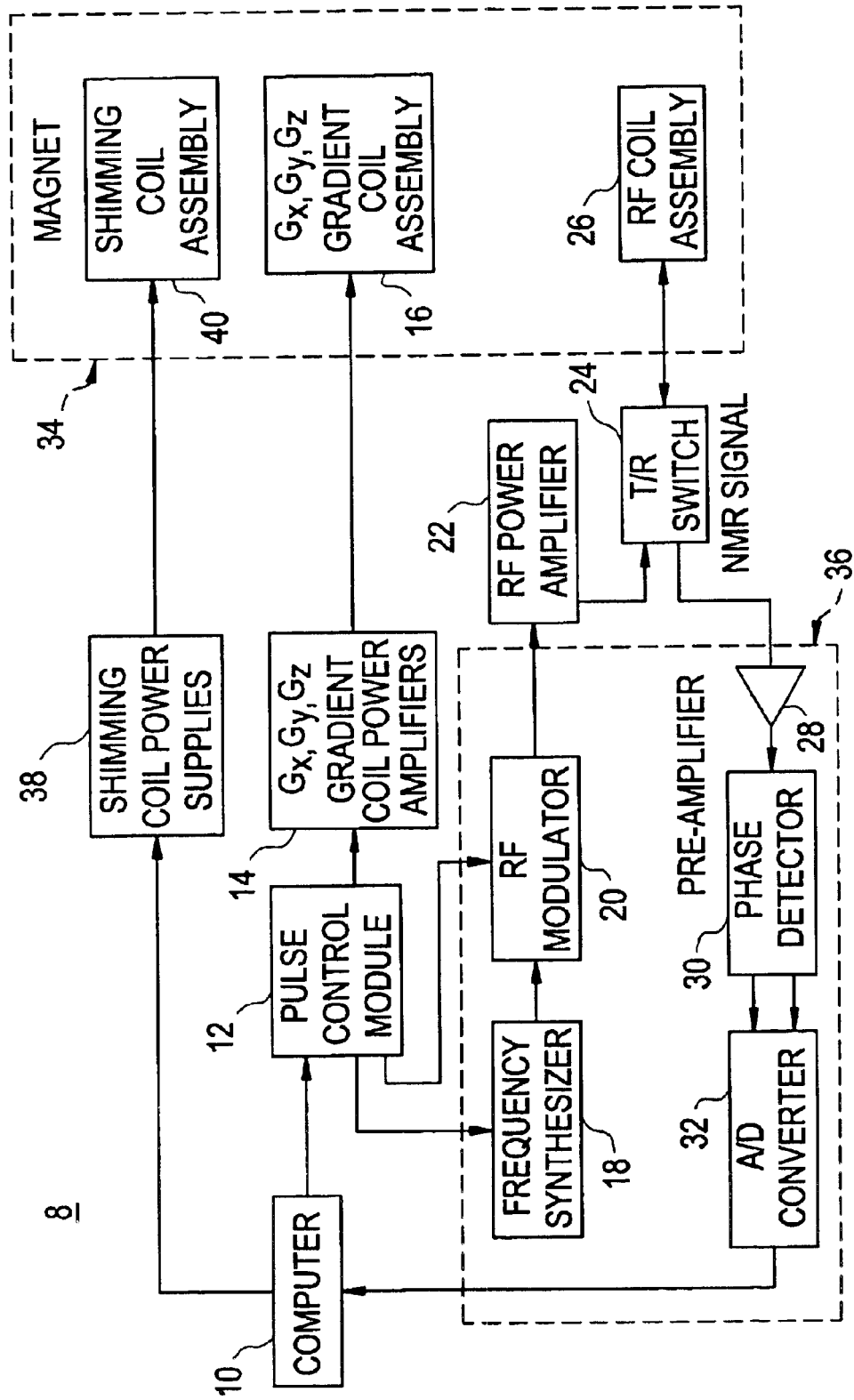
FIG. 1 is a schematic block diagram of an exemplary MR imaging system suitable for use with the present invention embodiments.

Referring initially to FIG. 1, an exemplary magnetic resonance (MR) imaging system 8 includes a computer 10, which controls gradient coil power amplifiers 14 through a pulse control module 12. The pulse control module 12 and the gradient amplifiers 14 together produce the proper gradient waveforms Gx, Gy, and Gz, for either a spin echo, a gradient recalled echo pulse sequence, a fast spin echo, or other type of pulse sequences. The gradient waveforms are connected to gradient coils 16, which are positioned around the bore of an MR magnet assembly 34 so that gradients Gx, Gy, and Gz are impressed along their respective axes on the polarizing magnetic field $B_0$ from magnet assembly 34.

The pulse control module 12 also controls a radio frequency synthesizer 18 that is part of an RF transceiver system, portions of which are enclosed by dashed line block 36. The pulse control module 12 also controls an RF modulator 20, which modulates the output of the radio frequency synthesizer 18. The resultant RF signals, amplified by power amplifier 22 and applied to RF coil 26 through transmit/receive switch 24, are used to excite the nuclear spins of the imaged object (not shown).

The MR signals from the excited nuclei of the imaged object are picked up by the RF coil 26 and presented to preamplifier 28 through transmit/receive switch 24, to be amplified and then processed by a quadrature phase detector 30. The detected signals are digitized by a high speed A/D converter 32 and applied to computer 10 for processing to produce MR images of the object. Computer 10 also controls shimming coil power supplies 38 to power shimming coil assembly 40.

As stated previously, phased array coils are commonly used in MRI as they offer improved SNR over an extended field of view (FOV). With the advent of parallel imaging techniques, it has also become important to obtain a reliable sensitivity assessment for each individual coil used in conjunction with sensitivity based (SENSE) reconstruction. In addition to the common signal intensity variations, local noise enhancement occurs to varying degrees according to the conditioning of the sensitivity-based reconstruction steps. This effect, which depends strongly upon the geometry of the particular coil arrangement, is quantitatively described by Pruessmann, et al. as the local geometry factor (g).

As will be appreciated, the geometry factor plays a significant role in designing SENSE arrays. The geometry factor is a mathematical function of the coil sensitivities and the reduction factor R, wherein R denotes the factor by which the number of samples is reduced with respect to conventional, full Fourier encoding. In practice, the coil structure generally does not permit straightforward analytical coil optimization. Thus, simulations have proven to be a valuable tool in seeking optimized coil arrangements for sensitivity encoding, involving the determination of geometry maps and base SNR.

The local SNR of a SENSE image is determined in accordance with the following equation:

$$SNR^{SENSE} = \frac{SNR^{Conventional}}{gR^{1/2}}$$

wherein $SNR^{Conventional}$ denotes the SNR obtained when the same coil array and imaging scheme are used with out reducing the number of phase encoding steps (i.e., in conventional image processing without SENSE techniques), thus requiring the complete scan time. It can be seen, therefore, that for an optimum SNR from SENSE produced images, the geometry factor of the coil should be kept to minimum (the ideal value being 1).

However, it will be appreciated that additional design constraints further dictate that each individual coil within an array be decoupled from their neighbors so that noise is uncorrelated. Generally, conventional coils with overlap decoupling tend to produce higher geometry-related noise enhancement and thus are not suited for SENSE imaging. Accordingly, other decoupling methods may be implemented. On the other hand, an underlap (non-overlap) of coils along a particular direction may result in a lack of signal detected in a plane perpendicular thereto. More specifically, it has been discovered that an underlap in the z-direction results in the absence of a signal in the xy-plane, while an underlap in either the x or y-directions does not cause an absence of signal in the corresponding planes. This is because the net magnetization vector rotates around the z-axis at all times.

Therefore, in accordance with an embodiment of the invention, there is disclosed a multiple channel (more particularly, an 8-channel) cardiac array coil that is arranged symmetrically in the three main imaging directions (i.e., superior-inferior, left-right, and anterior-posterior). The 8 elements are configured in such a manner so as to acquire images using the SENSE scan time reduction algorithm in all possible planes, including obliques and double obliques.

Figure 2:
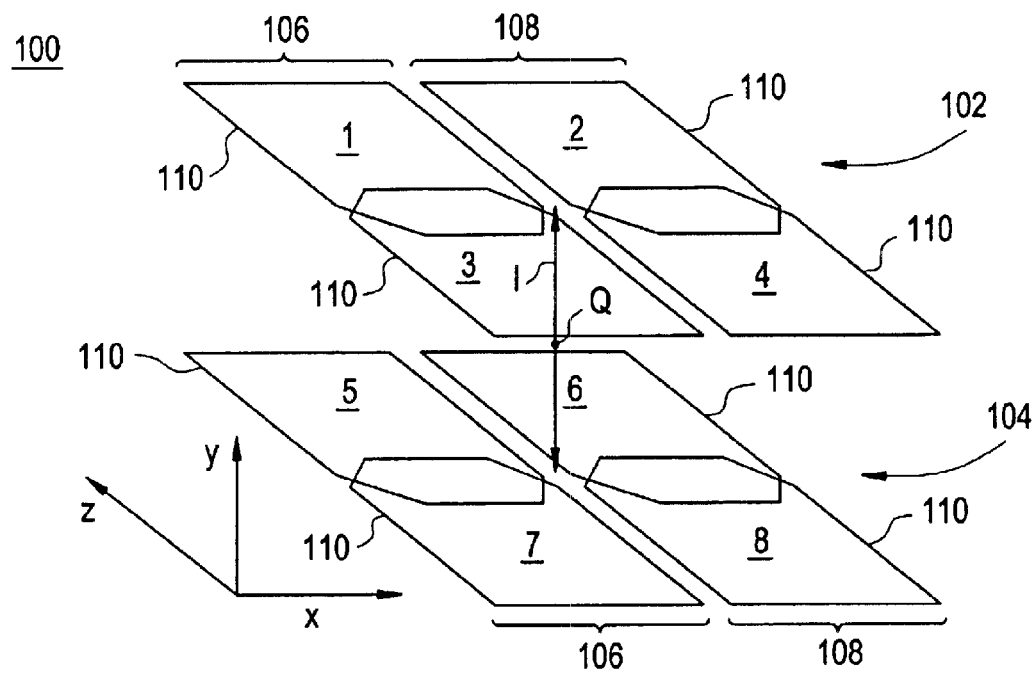
FIG. 2 is a perspective view of a multiple channel, cardiac array coil suitable for SENSE imaging, in accordance with an embodiment of the invention.

Referring now to FIG. 2, there is shown a schematical view (in perspective) of the cardiac array coil 100. The coil 100 is configured into an anterior section 102 that is symmetrically arranged with respect to a posterior section 104, and displaced therefrom about the y-direction (as illustrated by the coordinate axis legend in FIG. 2). In turn, both the anterior section 102 and the posterior section 104 are further divided into a left portion 106 and a right portion 108. The left and right portions 106, 108 are also symmetrically arranged with one another and displaced from one another about the x-direction. Each of the left and right portions 106, 108 has a pair of individual, overlapping surface coil elements 110 along the z-direction.

For ease of illustration and description, the individual coil elements 110 are labeled 1 through 8 in FIG. 2. As such, the anterior section 102 includes individual coil elements 110 numbered 1 through 4, while the posterior section 104 includes coil elements 110 numbered 5 through 8. Within the anterior section 102, the left portion includes coil element numbers 1 and 3, with the right portion includes coil element numbers 2 and 4. Correspondingly, the left portion of the posterior section 104 includes coil element numbers 5 and 7, while the right portion thereof includes coil element numbers 6 and 8. The symmetrical arrangement of the coil elements 110 with respect to each of the directional axes is illustrated by reference to an isocenter Q, which is a point positioned in a line, /, parallel to the y-direction. (Although the isocenter Q is shown positioned in line /, it should be understood that the isocenter indicates the "midpoint" with respect to all of the axes of the main magnetic field.) In operation, then, coil element numbers 1, 2, 3 and 4 are vertically aligned in the y-direction over coil element numbers 5, 6, 7 and 8, respectively.

Figure 3:
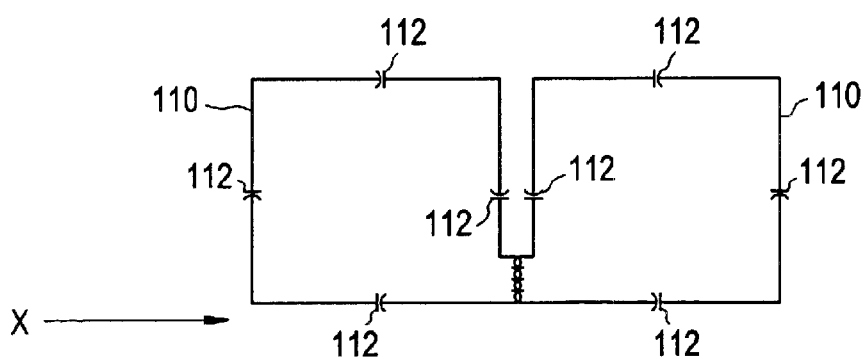
FIG. 3 is a circuit diagram illustrating decoupling of a pair of coil elements along the x-direction.

In order to create distinct sensitivity profiles for each coil element 110, the elements are preferably physically separated, creating an underlap. The individual coil elements 110 are decoupled from one another along the x-direction using a transformer decoupling method, while the elements 110 are decoupled from one another along the y-direction using preamplifier decoupling. In particular, FIG. 3 schematically illustrates the transformer decoupling between an exemplary pair of coil elements 110, along the x-direction. As mentioned previously, it was found that providing an underlap in the z-direction resulted in the absence of a detected signal in the perpendicular plane to the z-direction at the location of the underlap. In order to overcome this drawback, the elements 110 are overlapped in the z-direction, and are thus decoupled geometrically in this direction by the critical overlap method. It will also be noted in FIG. 3, that each coil element 110 includes four capacitive elements 112, within each of the four segments thereof, to provide RF resonance.

Figure 4:
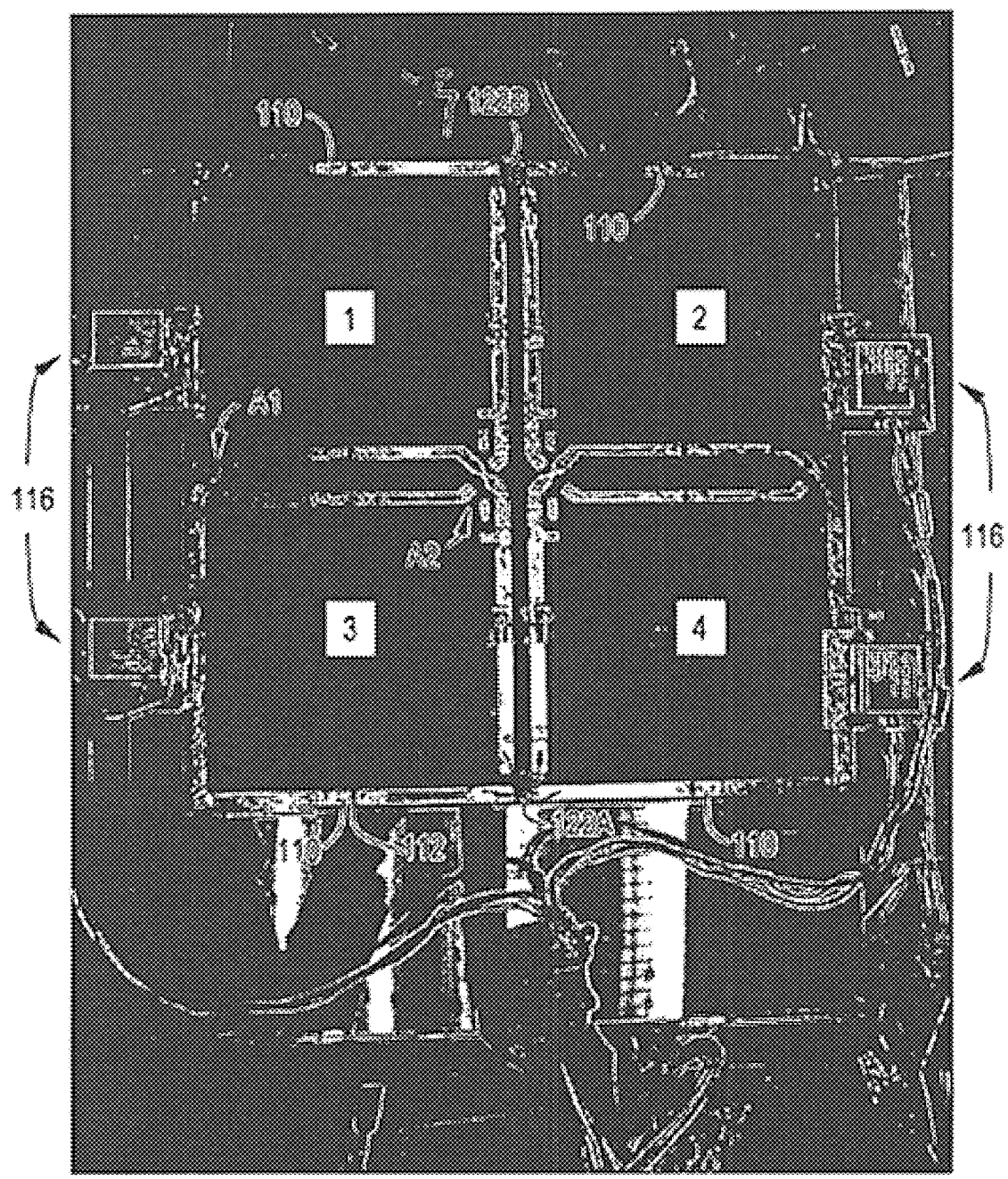
FIG. 4 is a detailed view of the layout of the anterior section of the cardiac array coil of FIG. 2.

FIG. 4 illustrates a more detailed view of the layout of the anterior section 102 of the coil 100. Since the layout for the anterior and posterior sections are essentially the same, only the anterior section 102 is shown for the sake of simplicity. As can be seen, the anterior section 102 includes four individual coil elements 110, which are again labeled element numbers 1 through 4. Each coil element 110 is generally rectangular in shape, and is formed from a generally flat, conductive material such as tin-plated copper. It will be noted that within each side of each of the generally rectangular coil elements 110, the capacitive elements 112 are shown between a gap within the segment of copper.

The manner of coil overlap (as between element numbers 1 & 3, and element numbers 2 & 4) in the z-direction is also illustrated. For example, at the overlap area of coil element numbers 1 and 3, the coil conductors are inwardly bent at an angle of about 45° from both sides, thereby resulting in two intersection points, A1 and A2, wherein the conductors from coil element numbers 1 and 3 overlappingly intersect at a generally perpendicular angle with respect to one another. More specifically, coil element number 3 overlaps coil element number 1 at points A1 and A2.

Finally, the transformer decoupling in the x-direction is also illustrated in FIG. 4. A first transformer 122a is located at an adjoining corner between coil element numbers 3 and 4. Similarly, a second transformer 122b is located at an adjacent corner between coil element numbers 1 and 2. Each of the coil elements 110 is shown provided with a preamplifier 116 for decoupling with a corresponding coil element in the posterior section 104 (not shown in FIG. 4).

Through the use of the above-described cardiac array coil 100, having eight elements arranged symmetrically around an isocenter, the enablement of SENSE acquisition on all slice orientations, especially double-oblique cardiac imaging is achieved. Thus configured, three kinds of decoupling methods are used with each individual coil element 110 to provide isolation among neighboring coil elements, while still accommodating SENSE capability in all imaging planes.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A multiple channel array coil for magnetic resonance imaging, comprising: an anterior section configured within a magnetic resonance imaging system; and a posterior section configured within the magnetic resonance system; said anterior and posterior sections displaced from one another about a first direction, and both of said anterior and posterior sections further comprising a left portion and a right portion displaced from one another about a second direction, with each of said left and right portions further comprising a superior coil element and an inferior coil element displaced from one another about a third direction; wherein each of said superior coil elements are arranged with an associated one of said inferior coil elements in an overlapping configuration, and each of said left portions are arranged with an associated one of said right portions in a non-overlapping configuration; and wherein said left and right portions of said anterior section are symmetrically aligned over said left and right portions of said posterior section.

2. The array coil of claim 1, wherein each of said left and right portions are isolated from one another by transformer decoupling therebetween.

3. The array coil of claim 2, wherein said anterior section is isolated from said posterior section by preamplifier decoupling.

4. A multiple channel cardiac array coil for magnetic resonance imaging, comprising: an anterior section configured within a magnetic resonance imaging system; a posterior section configured within the magnetic resonance imaging system; and said anterior and posterior sections symmetrically arranged and displaced from one another about a first direction, both of said anterior and posterior sections further comprising a left portion and a right portion symmetrically arranged and displaced from one another about a second direction, with each of said left and right portions further comprising a superior coil element and an inferior coil element symmetrically arranged and displaced from one another about a third direction; wherein each of said superior coil elements are arranged with an associated one of said inferior coil elements in an overlapping configuration, and each of said left portions are arranged with an associated one of said right portions in a non-overlapping configuration; and wherein each of said superior and inferior coil elements are generally rectangular in shape and are formed from a generally flat, conductive material.

5. The cardiac array coil of claim 4, wherein each of said left and right portions are isolated from one another by transformer decoupling therebetween.

6. The cardiac array coil of claim 5, wherein said anterior section is isolated from said posterior section by preamplifier decoupling.

7. The cardiac array coil of claim 4, wherein said left and right portions of said anterior section are symmetrically aligned over said left and right portions of said posterior section.

8. A magnetic resonance imaging (MRI) system, comprising:
a computer;
a magnet assembly for generating a polarizing magnetic field;
a gradient coil assembly for applying gradient waveforms to said polarizing magnetic field along selected gradient axes; and
a radio frequency (RF) transceiver system for applying RF energy to excite nuclear spins of an object to be imaged, and for thereafter detecting signals generated by excited nuclei of said object to be imaged, said RF transceiver system further comprising:
a multiple channel cardiac array coil having an anterior section and a posterior section;
said anterior and posterior sections displaced from one another about a first direction, and both of said anterior and posterior sections further comprising a left portion and a right portion displaced from one another about a second direction, with each of said left and right portions further comprising a superior coil element and an inferior coil element displaced from one another about a third direction; and
wherein each of said superior coil elements are arranged with an associated one of said inferior coil elements in an overlapping configuration, and each of said left portions are arranged with an associated one of said right portions in a non-overlapping configuration;
said left and right portions of said anterior section are symmetrically aligned over said left and right portions of said posterior section; and
wherein signals detected by said multiple channel array coil are processed by said computer to produce MR images of said object to be imaged.

9. The MRI system of claim 8, wherein said multiple channel cardiac array coil is configured for sensitivity encoding (SENSE) imaging techniques.

10. The MRI system of claim 8, wherein each of said left and right portions are isolated from one another by transformer decoupling therebetween.

11. The MRI system of claim 10, wherein said anterior section is isolated from said posterior section by preamplifier decoupling.

12. A method for configuring a multiple channel array coil suitable for use in sensitivity encoding for magnetic resonance imaging (MRI), the method comprising: arranging a first set of individual coil elements into an anterior section configured within a magnetic resonance imaging system; and arranging a second set of individual coil elements into a posterior section configured within the magnetic resonance imaging system; wherein said anterior and posterior sections are displaced from one another about a first direction, and wherein both of said anterior and posterior sections are further arranged into a left portion and a right portion that are displaced from one another about a second direction, with each of said left and right portions further being arranged from a superior coil element and an inferior coil element displaced from one another about a third direction; and symmetrically aligning said left and right portions of said anterior section over said left and right portions of said posterior section; wherein each of said superior coil elements are arranged with an associated one of said inferior coil elements in an overlapping configuration, and each of said left portions are arranged with an associated one of said right portions in a non-overlapping configuration.

13. The method of claim 12, further comprising isolating each of said left and right portions from one another by transformer decoupling.

14. The method of claim 13, further comprising isolating said anterior section from said posterior section by preamplifier decoupling.

15. A method for implementing sensitivity encoding for magnetic resonance imaging (MRI), the method comprising:

generating a polarizing magnetic field;

applying gradient waveforms to said polarizing magnetic field along selected gradient axes; and applying RF energy generated by an RF transceiver system to excite nuclear spins of an object to be imaged, and thereafter detecting signals generated by excited nuclei of said object to be imaged, wherein said RF transceiver system further includes:

an anterior section; and a posterior section;

said anterior and posterior sections displaced from one another about a first direction, and both of said anterior and posterior sections further comprising a left portion and a right portion displaced from one another about a second direction, with each of said left and right portions further comprising a superior coil element and an inferior coil element displaced from one another about a third direction;

said left and right portions of said anterior section symmetrically aligned over said left and right portions of said posterior section;

wherein each of said superior coil elements are arranged with an associated one of said inferior coil elements in an overlapping configuration, and each of said left portions are arranged with an associated one of said right portions in a non-overlapping configuration.

16. The method of claim 15, wherein each of said left and right portions are isolated from one another by transformer decoupling therebetween.

17. The method of claim 15, wherein said anterior section is isolated from said posterior section by preamplifier decoupling.

* * * * *